United States Patent
Goyal et al.

[19]

[11] Patent Number: 6,128,385

[45] Date of Patent: Oct. 3, 2000

[54] IMPACT-TOLERANT MOUNTING OF ACOUSTIC COMPONENTS

[75] Inventors: Suresh Goyal, Warren; Pratod V. Kasbekar, Manalapan; Harish S. Mangrulkar, Colonia; Sanjay Upasani, Manalapan, all of N.J.

[73] Assignee: Lucent Technologies, Inc., Murray Hill, N.J.

[21] Appl. No.: 09/096,759

[22] Filed: Jun. 12, 1998

Related U.S. Application Data

[63] Continuation-in-part of application No. 08/940,833, Sep. 30, 1997, Pat. No. 5,982,882, and a continuation-in-part of application No. 09/075,566, May 11, 1998, and a continuation of application No. 08/941,504, Sep. 30, 1997.

[51] Int. Cl.[7] ............................. H04M 1/00; H04R 25/00
[52] U.S. Cl. ........................ 379/433; 381/355; 381/361
[58] Field of Search ...................................... 379/433, 428, 379/420; 381/355, 360, 361, 364, 366, 369, 150; 181/0.5

[56] References Cited

U.S. PATENT DOCUMENTS

| | | | |
|---|---|---|---|
| 4,690,242 | 9/1987 | Mark | 181/0.5 |
| 4,773,091 | 9/1988 | Busche et al. | 379/433 |
| 5,613,011 | 3/1997 | Chase et al. | 381/355 |
| 5,802,198 | 9/1998 | Beavers et al. | 381/355 |
| 5,982,882 | 11/1999 | Kasbekar et al. | 379/433 |

*Primary Examiner*—Jack Chiang
*Attorney, Agent, or Firm*—Henry I Schanzer; Michael Y. Epstein

[57] ABSTRACT

Acoustic component sub-assemblies for direct mounting on a telephone handset inner substrate comprise a tubular housing containing a component having terminal pins electrically connected within the tubular housing to coil springs extending outwardly through an open end of the tubular housing. The coil springs serve as component terminals for spring biased contact with conductive lands on the substrate. The tubular housing is press fitted within a seat on the substrate and contacted by the handset outer housing for being tightly clamped within the substrate seat.

11 Claims, 4 Drawing Sheets

FIG. 1
(PRIOR ART)
FIG. 2
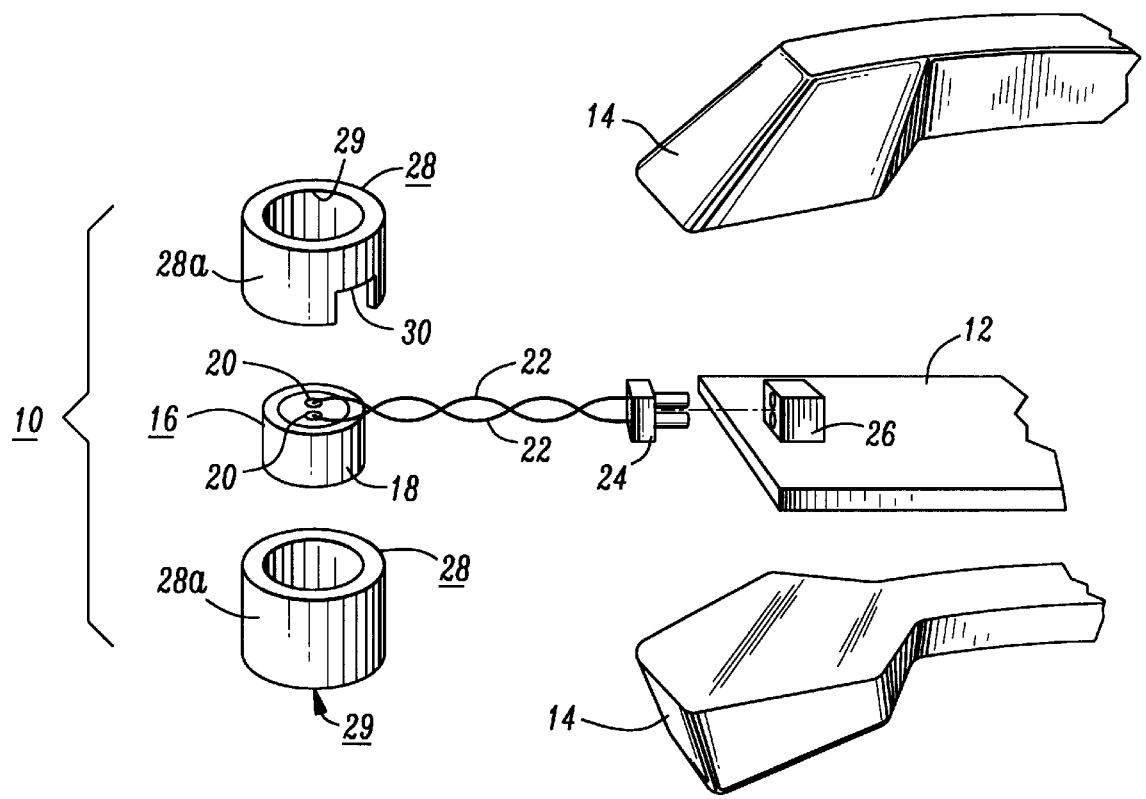
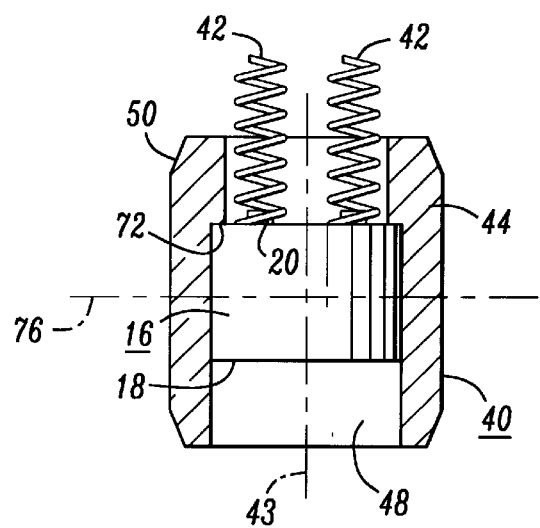

IMPACT-TOLERANT MOUNTING OF ACOUSTIC COMPONENTS

This is a continuation-in-part application of Ser. No. 08/940,833, filed Sep. 30, 1997 U.S. Pat. No. 5,982,882, and Ser. No. 09/075,566, filed May 11, 1998 a continuation of Ser. No. 08/941,504 filed Sep. 30, 1997.

BACKGROUND OF THE INVENTION

This invention relates, in general, to portable electronic devices manufactured using automated assembly processes, and particularly to impact-tolerant mounting of acoustic components (microphones, speakers, buzzers and the like) within such devices.

By way of example, the invention is described in connection with the automated manufacture of a telephone handset of known type, and particularly in connection with the mounting of a microphone sub-assembly within the handset. By "impact tolerant" is meant that the component is so mounted (particularly important in portable devices) for withstanding relatively severe mechanical shocks such as caused by the dropping of the portable device.

As last steps in the manufacture of a telephone handset, a fairly rigid substrate, which may comprise one or more printed circuit boards with various electronic/optical components mounted thereon, is sandwiched between two molded plastic housing halves which are snap-fitted or otherwise fastened together. These last steps are well suited for automated assembly processes using relatively simple robotic (programmed) tools. A complication in the assembly process, however, relates to the mounting of a microphone sub-assembly which must also be mounted within the telephone handset.

In one arrangement, the microphone sub-assembly comprises a quite small circular cylinder having end ports for admitting sound to a transducer within the cylinder and a two-part molded plastic or hard rubber container snap-fitted around the microphone cylinder. The container serves a number of roles: it encloses and protects the microphone (as well as providing one or more internal acoustic sound chambers); it provides a preselected configuration for firm mounting of the container within the handset housing; and it provides a sealed exit port for wires from the microphone to a wire terminating connector which, as part of the assembly process, is snap-fitted within a mating connector on the component containing substrate.

The afore-mentioned complication presented by the microphone sub-assembly is that it is quite difficult to assemble the subassembly into the handset. Thus, in addition to the steps of picking-up and properly orienting and mounting the sub-assembly, the connector at the end of the microphone wires must be inserted into its mating connector on the substrate, and the microphone wires must be properly nested within the handset housing. If the wires are not properly nested, they can be pinched between the two housing halves when they are snap-fitted together. This, of course, causes numerous problems. Indeed, owing to the difficulty of assembling the microphone sub-assembly into the handset housing, such assembling is generally done by hand rather than, as preferred, by machine.

Additionally, although the microphone sub-assembly end connector is press-fitted into its mating connector, for firm fit, experience has shown that the connector all too frequently comes loose when quite common handling accidents occur, e.g., the dropping of the telephone handset.

These problems are addressed by the present invention.

SUMMARY OF THE INVENTION

An acoustic component comprising an enclosure having a central axis includes a pair of coiled spring terminals extending from a first end of the enclosure in directions generally parallel to the enclosure axis. The component is disposed within a hollow, cylindrical housing with the component enclosure first end spaced inwardly from a first, open end of the housing. The spring terminals extend through and beyond the housing first end.

In a preferred embodiment, the housing comprises a strip of an elastomeric material wrapped around and adhered to the component enclosure.

Firm, and impact tolerant electrical connections to the component terminals are obtained by firmly pressing the ends of the coiled springs against electrical conducting pads on, for example, a printing wiring board substrate, and locking the component-housing sub-assembly in place with the coiled springs compressively stressed. Preferably, the component-housing sub-assembly is press-fitted within a seat on the substrate and clamped firmly in place by contact with a handset outer member snap-fitted around the substrate.

BRIEF DESCRIPTION OF THE DRAWINGS

The drawings are schematic and not to scale.

FIG. 1 is a view, in perspective and exploded, of a known microphone sub-assembly for use in a telephone handset;

FIG. 2 is a side sectional view of a microphone sub-assembly in accordance with one embodiment of this invention;

DESCRIPTION OF PREFERRED EMBODIMENTS

Figure 3:
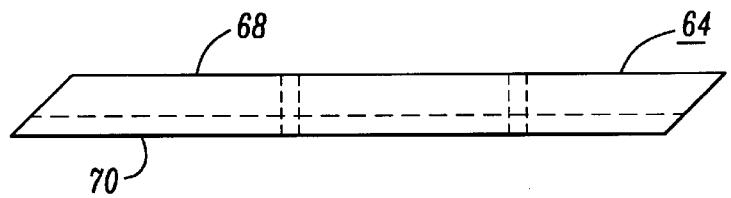
FIGS. 3 and 4 are plan and side views, respectively, of a strip of material used to provide a microphone housing shown in FIG. 2.

FIG. 1 shows an example of a prior art microphone sub-assembly 10 and a portion of a substrate 12 to which the sub-assembly 10 is connected. Both the microphone sub-assembly and the substrate are disposed within a telephone handset housing formed by molded plastic housing halves 14 which are snap-fitted together onto and around the substrate in known manner.

The microphone sub-assembly 10 comprises a microphone 16 comprising a circular cylindrical can 18 containing an acoustically sensitive diaphragm producing an electrical signal picked-up by two electrodes connected to terminal pins 20 extending a short distance outwardly from the can 18. The two pins are soldered to the ends of wires 22 terminating in a connector 24 for mating with a corresponding connector 26 mounted on the substrate 12. The microphone 16 is disposed within a container 28 shown in FIG. 1 as comprising two halves 28a which are glued together. The container 28, e.g., of plastic or rubber, protects the microphone as well as providing one or more acoustic chambers adjoining sound entry ports into the microphone for providing certain processing of the sound reaching the microphone diaphragm. (In microphones, such as the illustrative one shown herein, having noise-cancelling characteristics, sound ports are provided at both ends of the microphone can. In use of the microphone, one end faces directly towards a speaker whose speech enters through the microphone one end along with ambient noise. The ambient noise also enters the other end of the microphone which, because of the position of the microphone other end, receives little of the speech sounds. To some extent, aided by electronics on the substrate, the two identical noise signals entering the microphone from opposite ends tend to cancel one another.)

The container 28 has open ends 29 for admitting sounds into the acoustic chambers. Preferably, for good sound quality, the container should completely acoustically seal the microphone except for the intended sound ports. A problem with the two piece container, however, is that, as indicated in FIG. 1, a small slot 30 is provided through the wall of one of the container halves 28a for the exiting of the microphone wires. While the two container halves are sealed together along with a sealant fluid placed in the slot 30 for acoustically sealing it, small leakage paths for sound do occasionally occur which are quite detrimental to sound quality. This is one problem solved according to the present invention.

Although not shown in FIG. 1, as being known, the microphone sub-assembly 10 is mounted within a seat or pocket formed by the housing halves 14, and electrical connections between the microphone and the substrate 12 are by way of the wires 22 and the connectors 24 and 26. A problem created by this arrangement, previously referred to, is that the handset assembly process requires that the microphone connector 24 be first mated with the substrate mounted connector 26, and the microphone container 28 then be seated in one of the housing halves with the microphone wires properly nested within the housing half so as not to be pinched between mating portions of the housing halves. While proper assembly is regularly obtained, the care required to accomplish it generally precludes the use of simple-minded robotic tools. This is one problem solved by this invention.

A still further problem of the prior art arrangement shown in FIG. 1 is that the connection between two connectors 24 and 26 tends to be loosened when the assembly is mechanically shocked, e.g., as by being dropped. This leads to defective operation, or to total failure of operation, and a more sturdy arrangement is desirable. This is provided according to this invention.

One embodiment of the invention is shown in FIG. 2. Shown therein is a microphone sub-assembly 40 which includes a microphone 16 which can be identical to the microphone 16 shown in FIG. 1 and including two outwardly extending terminal pins 20. In the prior art arrangement shown in FIG. 1, the pins 20 are soldered to wires 22. In the inventive sub-assembly 40, however, two coiled springs 42 are electrically and mechanically secured to the two pins 20, as by soldering. The microphone can 18 is cylindrical and has a central axis 43. The two pins 20 and the springs 42 connected to the pins 20 extend parallel to the axis 43.

As noted, the springs 42 are soldered to terminal pins 20 provided on commercially available microphones. Alternatively, the microphones can be fabricated with electrode contacting wires terminating in integral coiled springs.

In the inventive sub-assembly 40, the microphone 16 is disposed within a tubular housing 44 in the form of a circular cylinder of uniform outside diameter except for both ends 50 of the housing which taper inwardly for ease of mounting of the housing 44 within a seat 52 (FIG. 7) within the telephone handset.

The inside diameter of the housing 44 has two uniform inner diameters; one uniform inner diameter being at locations above and below the microphone, and the other uniform diameter corresponding to the outer diameter of the microphone can. In a preferred embodiment, the housing 44 is of an elastomeric material, that is, an elastic material such as hard rubber or, preferably, a known elastic plastic material such as Santoprene, a tradename of Advanced Elastomeric Systems, Akron, Ohio, or Lomod, a tradename of G.E. Plastics, Pittsfield, Mass.

Figure 4:
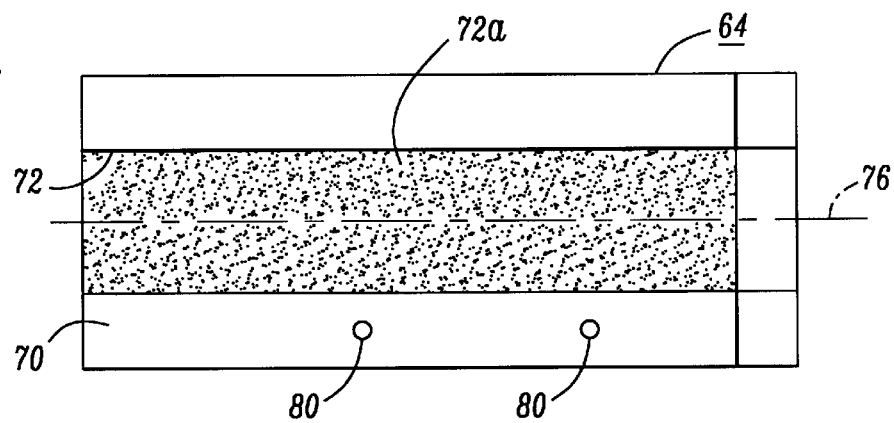

FIGS. 3 and 4 show a strip 64 of such elastomeric material. The strip is to be wrapped around and adhered to the microphone can 18 (FIG. 2) and, to this end, a first surface 68 (FIG. 3) of the strip 64 is flat while a second surface 70 of the strip has an indentation 72 (FIG. 4) coated with a layer 73 of a known pressure sensitive or epoxy adhesive material, or the like. Also, to provide a neat and tight fitting joint between the ends of the strip 64 when wrapped around the microphone can 18, the strip side edges are beveled as shown in FIG. 3 or edge indented as shown in FIG. 5.

The strip 64 shown in FIG. 4 is shown oriented similarly as the strip (the housing 44) is shown oriented in FIG. 2. A horizontal axis 76 is shown in FIGS. 2 and 4, and the adhesive containing indentation 72 is centered on and parallel to the axis 76. The width or vertical (FIG. 4) length of the indentation is equal to the length of the microphone can 18 along its axis 43 and, as shown in FIG. 2, the can 18 fits snugly within the indentation 72 when the strip 64 is wrapped around the microphone. In the wrapping process, the strip indentation 72 provides a means for precisely aligning and positioning the microphone 16 within the housing 44. The adhesive layer 73 on the indentation firmly adheres the strip to the microphone with the strip side (beveled) ends forming a tightly fitting overlapping joint with the ends of the microphone can.

The wrapped around strip 64 comprises, as explained, the tubular housing 44. The housing 44 serves as a means for mounting the microphone sub-assembly 40 within the handset. To this end, the tubular housing 44 is relatively rigid. This requires that the strip 64 wrapped around the microphone be itself rigid. In general, by using a strip 64 of one of the aforementioned materials and having a thickness of at least about 2 mm, adequate rigidity of the resultant housing 44 is obtained while still providing sufficient flexibility of the strip 64 for ease of wrapping.

Figure 5:
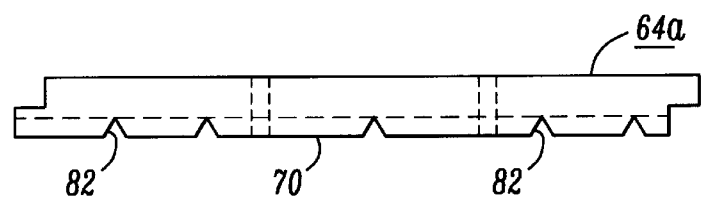
FIGS. 5 and 6 are similar to FIGS. 3 and 4, respectively, but showing a modification of the strip shown in FIGS. 3 and 4.
Figure 6:
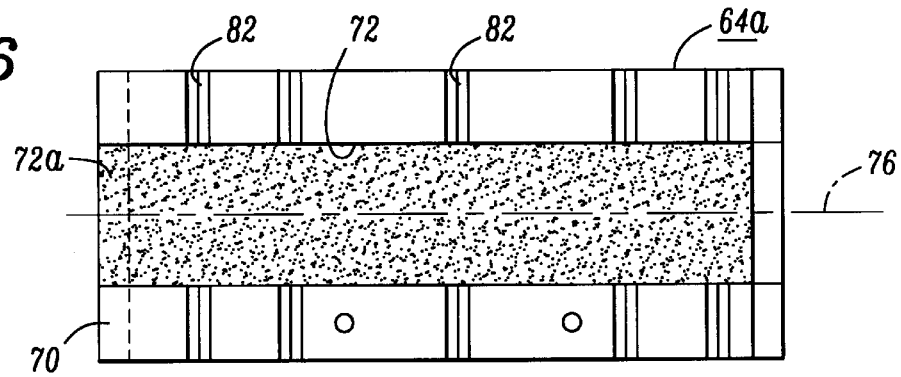

Additional flexibility for greater ease of wrapping can be provided as shown in FIGS. 5 and 6. In the strip 64a illustrated, similar to the strip 64 shown in FIGS. 3 and 4, and including an adhesive coated indentation 72a, a number of longitudinally extending score lines 82 are provided on what is to be the inside surface 70a of the housing.

Preferably, but not critically, the score lines 82 have a depth about the same as the depth of the adhesive coated indentation 72a. The score lines 82 thus do not continue across the indentation.

In the wrapping process, the score lines 82 serve as hinges for providing greater flexibility of the strip 64a. By omitting the score lines across the strip indentation 72a, full surface to surface contact is provided between the adhesive coated indentation 72a and the microphone can 18 outer surface.

Figure 7:
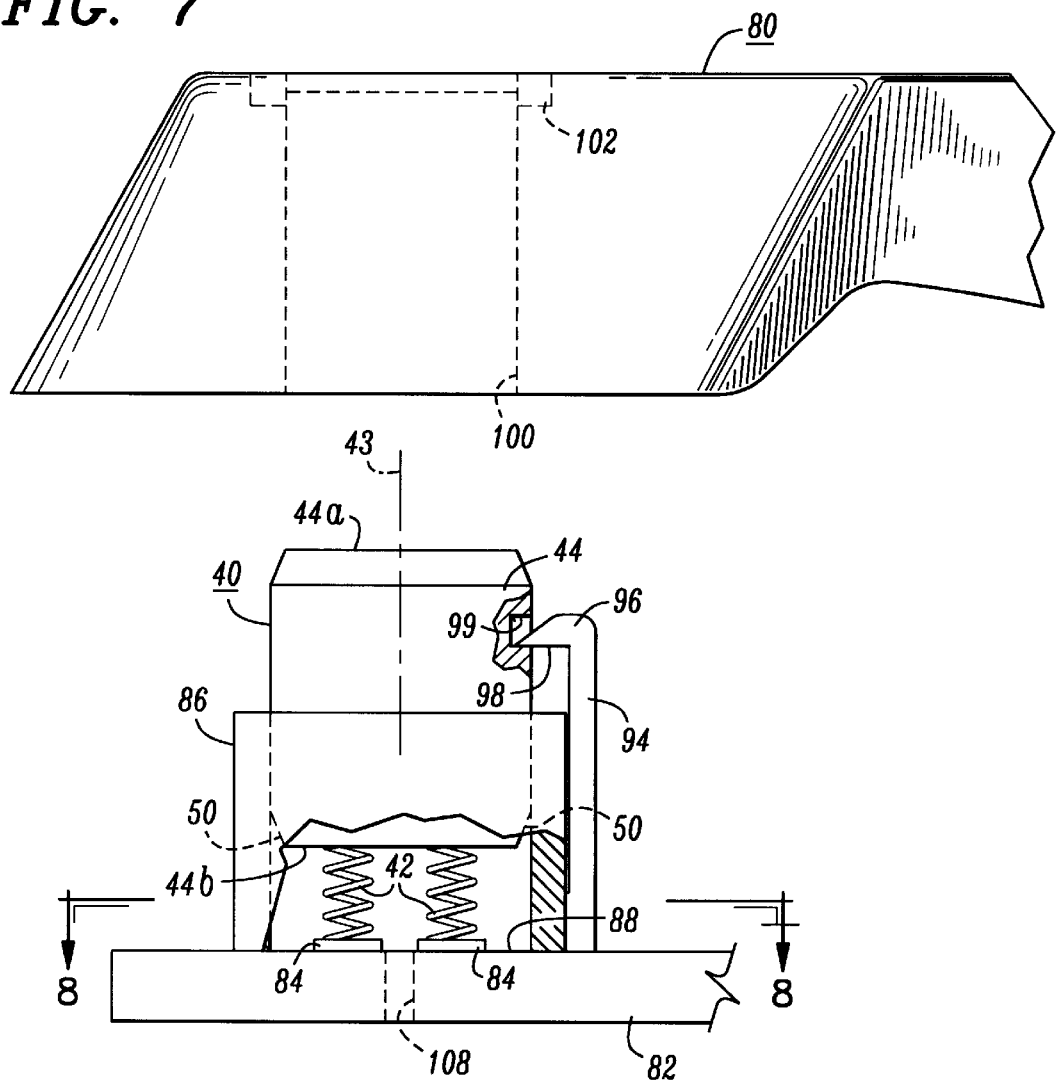
FIG. 7 is an exploded, side elevational view of a telephone handset including the microphone sub-assembly shown in FIG. 2.
Figure 8:
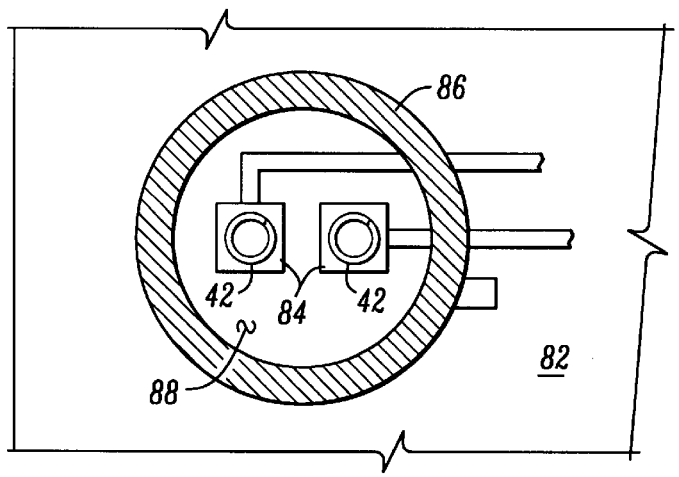
FIG. 8 is a sectional view taken along line 8—8 of FIG. 7.

The sub-assembly 40 shown in FIG. 2 is now ready for being mounted within, in this embodiment, a telephone handset 80, as shown in FIG. 7. The handset 80 is quite similar to the handset 14 shown in FIG. 1 and, similarly as the handset 14, includes a substrate 82 similar to the substrate 12 shown in FIG. 1. Unlike the FIG. 1 arrangement, however, where the microphone pins 20 are connected to electrical components on the substrate 12 via wires 22 and a connector 24, the microphone pins 20 in the inventive arrangement are respectively connected to the aforementioned coiled springs 42 which are compressedly engaged with respective metalized areas 84 (FIG. 8) on the substrate 82. To this end, one of the layers of the substrate 82, e.g., of a molded, plastic material, has (FIG. 7) a circular, cylindrical seat 86 integrally formed thereon for snug receipt of the microphone sub-assembly 40. On the bottom wall 88 FIG. 8) of the seat are the two metal contact areas 84 which are each connected, by known printed wire paths on the substrate 82, to other components (not shown) on the substrate for processing the microphone output signals in known fashion.

In the process of mounting the microphone sub-assembly 40 on the substrate 82, all that is required is that the sub-assembly housing 44 be force-fitted into the substrate seat 86 until the two springs 42 bottom against respective contact pads 84. The required assembly movements are quite simple and can be readily done by robotic means. The (FIG. 2) tapered front end 50 of the housing 44 facilitates entry of the housing into the seat 86. Owing to the elasticity of the housing 44, exceptionally close tolerances are not required and, by causing some compression of the housing 44 during the insertion process, the sub-assembly 40 tends to stay firmly in place within the substrate seat 86 during the subsequent assembly processes for completing the handset 80.

Within the substrate seat 86, the coiled springs 42 of the microphone sub-assembly are in contact with the substrate conductive areas 84. Preferably, the springs 42 are compressively strained to provide a spring force urging the ends of the springs 42 against the contact areas 84. The initial compression of the springs can be done during the process of inserting the sub-assembly into the substrate seat and thereafter relying upon some simple latching mechanism for locking the sub-assembly 40 in place. In FIG. 7, for example, the seat 86 is shown provided with an upwardly extending elastic arm 94 terminating in a tapered "flag" 96 having a flat latching surface 98. As the sub-assembly is moved downwardly into the substrate seat 86, the tapered flag 96 is forced out of the path of the housing 44 (thus bending the elastic arm 94) until an indent 99 in the housing outer surface reaches the latching surface 98. The bent elastic arm 94 then springs forwardly into the indent for latching the sub-assembly within the substrate seat 86 and for maintaining the compressive straining of the sub-assembly coiled springs 42.

Alternatively (or in combination with the latching mechanism shown in FIG. 7), locking of the microphone sub-assembly 40 within the substrate seat 86 is accomplished by the mating handset halves 80a which are snapped in place onto and around the substrate 82. As shown in FIG. 7, when the sub-assembly 40 is disposed within the substrate seat 86, the central axis 43 of the housing 44 is transverse to the main plane of the substrate 82. The open rear end 44a of the microphone sub-assembly housing 44 serves to admit sound to the microphone 16 within the housing 44 and, to this end, a sound admitting port 100 in one of the handset halves 80a is aligned with the housing rear end 44a. Preferably, a rubber O-ring 102 is disposed on the inside surface of the handset half 80a in surrounding relation with the sound port 100 therethrough. When the handset halves are assembled onto the substrate, the O-ring 102 is press-fitted against the housing rear end 44a for firmly forcing the housing 44 inwardly of the substrate seat 86 for causing or ensuring proper compressive straining of the sub-assembly coiled springs 42. The handset housing halves are firmly locked together (in known snap-fit relation) around the substrate and maintain the microphone sub-assembly firmly seated within the substrate seat.

The fit of the O-ring 102 against the end 44a of the microphone sub-assembly housing 44 effectively acoustically seals the opening into the sub-assembly. Thus, the microphone is sealed from any sounds arriving at the microphone other than through the handset sound port.

The front end 44b of the microphone sub-assembly housing 40 can be acoustically sealed by contact with the bottom wall 88 of the substrate seat 86. Alternatively, openings 108 can be provided through the seat bottom wall 88 for admitting sounds into the front end 44b of the sub-assembly 40 for, as previously discussed, known noise-cancellation purposes.

As previously indicated, a principal feature of the invention is the use of compressively strained coil springs 42 for making electrical connections between the microphone end terminals 20 and contact areas 84 on the substrate 82. With the microphone sub-assembly 40 firmly locked in place within the substrate seat 86, as previously described, severe mechanical strainings and vibrations can be withstood, by being absorbed in the compressed (but not fully compressed) springs 42, without failure or even deterioration of the electrical connection between the microphone and the substrate contact areas.

Figure 9:
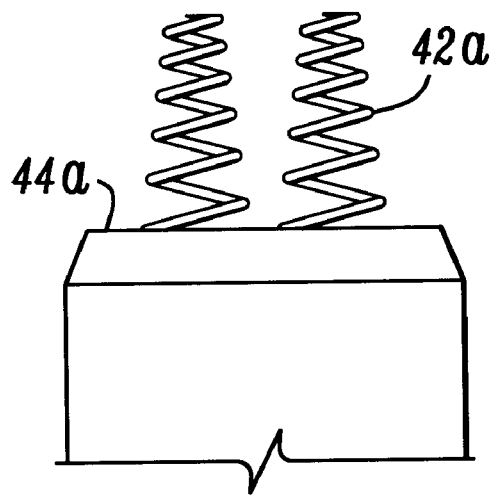
FIGS. 9 and 10 are side sectional views of a portion of respective microphone sub-assemblies in accordance with second and third embodiments of this invention.
Figure 10:
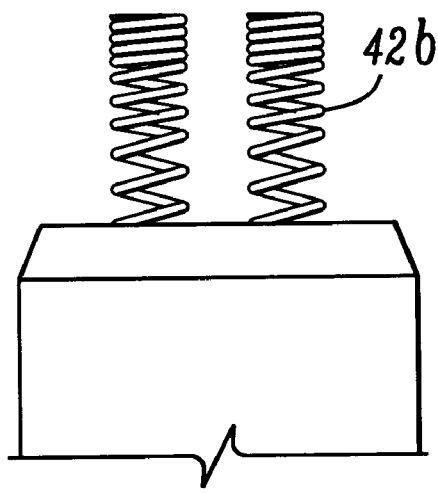

In the arrangement shown in FIG. 2, the coiled springs 42 are cylindrical. FIG. 9 shows the use of conical springs 42a of decreasing diameter with distance from the microphone 16. An advantage of this is that, by designing the springs such that each smaller coil can fit wholly inside its adjoining larger coil, the springs can be compressed in height to the thickness of a single coil, This allows a large elastic range of the springs while minimizing space requirements. The conical springs also have a variable stiffness which can help in not exciting resonance during spring vibration. (A variable spring stiffness is also achievable with helical springs 92b, as shown in FIG. 10, but with a variable pitch, i.e., a variable spacing of coils along the spring length.) The housing 44 (FIG. 2) illustrated herein is similar to a microphone subassembly housing shown in co-pending, parent application Ser. No. 08/941,504 (refiled as Ser. No. 09/075, 566). Alternatively, the housing 44 can be similar to the microphone subassembly housing shown in co-pending, parent application Ser. No. 08/940,833. That is, the housing can be of a rigid, plastic material including a circular passageway therethrough within which the microphone 16 (with springs 42 or 42a) is force-fitted for snug-fit.

As mentioned, the coil springs provide an impact-tolerant mounting of the microphone sub-assemblies illustrated. Other components, such as the aforementioned speakers and buzzers and the like, can be similarly mounted by means of the illustrated coil spring terminals.

An advantage of the coiled spring terminals, as previously disclosed, is that they can provide large elastic ranges of movement with low fluctuation in contact force. A certain amount of contact force is necessary to maintain good electrical contact, which is usually achieved through precompression of the spring. At the same time, it is desired that the contact force not change much as the compression of the contact-spring changes as a result of relative motion induced due to impact. This is achieved by designing the contact spring to be a soft spring.

What is claimed is:

1. An acoustic component sub-assembly comprising a tubular wall having an open end, an acoustic component having terminal pins within said tubular wall, and metal coil springs connected to respective component terminal pins, said springs extending outwardly from said tubular wall through said end opening and comprising component terminals for making spring biased contacts external to said sub-assembly.

2. A sub-assembly according to claim 1 in combination with a substrate containing conductive lands on a surface of the substrate, the sub-assembly being mounted on said substrate with said sub-assembly springs directly contacting said substrate lands.

3. A sub-assembly according to claim 2 wherein said springs have a cylindrical shape.

4. A sub-assembly according to claim 2 wherein said springs have a conical shape decreasing in diameter with distance from said pins.

5. A sub-assemmbly according to claim 2 wherein said tubular wall is elongated along a first axis passing through said open end of said wall, said conductive lands are disposed on a planar surface of said substrate, and said sub-assembly being mounted on said surface with said housing axis being disposed transversely of said substrate surface.

6. A sub-assembly according to claim 5 wherein said coiled springs are elongated along axes parallel to said first axis for being compressively strained by contact with said substrate conductive lands.

7. A sub-assembly according to claim 6 wherein said sub-assembly is press fitted within a seat on said substrate and is locked in place within said seat.

8. A sub-assembly according to claim 7 wherein said sub-assembly is locked in place by a latching mechanism mounted on said substrate for latching contact with a portion of said tubular wall of said sub-assembly.

9. A sub-assembly according to claim 7 including a housing enclosing said substrate and said sub-assembly, and said sub-assembly is locked in place by a portion of said housing engaging a portion of said tubular wall.

10. A sub-assembly according to claim 2 wherein said coil springs have a variable pitch.

11. A sub-assembly according to claim 5 wherein said component is a microphone having a sound admitting port facing towards said open end.

* * * * *